United States Patent
Cronie et al.

(10) Patent No.: US 9,014,251 B2
(45) Date of Patent: Apr. 21, 2015

(54) RANK-ORDER EQUALIZATION

(71) Applicant: Kandou Labs SA, Lausanne (CH)

(72) Inventors: Harm Cronie, Poliez-le-Grand (CH); Klaas Hofstra, Lausanne (CH); Amin Shokrollahi, Preverenges (CH)

(73) Assignee: Kandou Labs, S.A. (CH)

( * ) Notice: Subject to any disclaimer, the term of this patent is extended or adjusted under 35 U.S.C. 154(b) by 0 days.

(21) Appl. No.: 14/297,579

(22) Filed: Jun. 5, 2014

(65) Prior Publication Data

US 2014/0286387 A1 Sep. 25, 2014

Related U.S. Application Data

(63) Continuation of application No. 13/421,801, filed on Mar. 15, 2012, now Pat. No. 8,755,426.

(51) Int. Cl.
*H03H 7/30* (2006.01)
*H04B 1/10* (2006.01)
*H04L 27/01* (2006.01)
*H03H 17/02* (2006.01)

(52) U.S. Cl.
CPC ...... *H04L 27/01* (2013.01); *H04B 1/10* (2013.01); *H03H 17/0263* (2013.01)

(58) Field of Classification Search
CPC ............ H04L 25/03057; H04L 2025/0349; H04L 25/03038; H04L 25/067; H04L 2025/03617; H04L 2025/03496; H04L 2025/03477; H04L 2025/03503; H04L 25/03146; H04L 25/03267; H04L 2025/03471; H04L 27/01; H04L 25/03885; H03H 17/0263
USPC .................................. 375/230–236, 350
See application file for complete search history.

(56) References Cited

U.S. PATENT DOCUMENTS

| | | | |
|---|---|---|---|
| 5,581,494 A | 12/1996 | Sommen et al. | |
| 6,535,553 B1 | 3/2003 | Limberg et al. | |
| 2002/0159543 A1* | 10/2002 | Perlow et al. | 375/324 |
| 2005/0084028 A1* | 4/2005 | Yu et al. | 375/267 |
| 2006/0098726 A1* | 5/2006 | Pan et al. | 375/229 |

* cited by examiner

Primary Examiner — Don N Vo
(74) Attorney, Agent, or Firm — Invention Mine LLC

(57) ABSTRACT

For digital data transmitted using a vector signaling encoding, a rank-order equalizer cancels various channel noise such as inter-symbol interference. Further, rank-order units may be cascaded to achieve improved equalization over successive sample vector signals in a rank-order equalizer. Multiple rank-order equalizers further operate in parallel in a feed forward mode or in series in a feedback mode to provide a continuous vector signaling stream equalization.

11 Claims, 11 Drawing Sheets

(a)

(b)

(c)

(d)

RANK-ORDER EQUALIZATION

CROSS-REFERENCE TO RELATED APPLICATIONS

The present application is a continuation of U.S. patent application Ser. No. 13/421,801, filed Mar. 15, 2012, now U.S. Pat. No. 8,755,426, issued Jun. 17, 2014, which is incorporated herein by reference in its entirety.

The following prior applications are herein incorporated by reference in their entirety for all purposes:

U.S. patent application Ser. No. 12/784,414, filed May 20, 2010, naming Harm Cronie and Amin Shokrollahi as inventors, entitled "Orthogonal Differential Vector Signaling" (hereinafter "Cronie I");

U.S. patent application Ser. No. 12/982,777, filed Dec. 30, 2010, naming Harm Cronie and Amin Shokrollahi as inventors, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli as inventors, entitled "Methods and Systems for Noise Resilient, Pin-Efficient and Low Power Communications with Sparse Signaling Codes" (hereinafter "SPM");

U.S. patent application Ser. No. 13/176,657, filed Jul. 5, 2011, naming Harm Cronie and Amin Shokrollahi as inventors, entitled "Methods and Systems for Low-power and Pin-efficient Communications with Superposition Signaling Codes" (hereinafter "SUPM").

FIELD OF THE INVENTION

The present invention relates generally to the field of communications, and more particularly to the transmission of signals capable of conveying information within and between integrated circuit devices.

BACKGROUND

One goal of a communication system is to transport information from one physical location to another. In most electronic communication systems, the communication itself takes place between electronic components. Often, these electronic components are integrated circuits ("ICs") and this communication setting is referred to as "chip-to-chip communication." The communicating electronic components might be located in the same apparatus, such as the communication between a central processing unit ("CPU") and memory inside a computer, tablet computing device, or other mobile device. Another example is the communication between two CPU cores that are integrated on the same chip. Yet another example is the communication between a Graphics Processing Unit ("GPU") and memory on a graphics card. In these cases, the actual communication takes place over wires on a printed circuit board ("PCB") and/or metal wires integrated in a chip and these wires carry electrical signals. It should be apparent upon reading this disclosure that other possibilities exist. The communication may, for instance, take place wirelessly or over an optical fiber.

In some cases, communication takes place between components that are located in different apparatuses, in which case this type of communication is sometimes called device-to-device communication. An example of this situation is a digital photo camera that is connected to a computer. In this setting, the communication takes place over a physical cable or wirelessly, wherein the physical cable may consist of one or several wires. Another example is a set of computers that is connected to a network. The electronic components on the network card of each computer communicate with the electronic components of another network card of yet another computer.

In all these communication settings, a goal is to transmit digital information from one electronic component to another in a reliable and efficient way. In this context, digital information is to be understood as information available in discrete, i.e., discontinuous values. Bits, a collection of bits, but also numbers from a finite set can be used to represent digital information. The efficiency of the communication can be expressed in terms of the time it takes to transfer a certain amount of information (speed), the energy that is required to transmit the information reliably (power consumption) and the number of wires per bit that is required for communication (pin-efficiency). In most systems, several trade-offs exist between these parameters and, depending on the application, some of these parameters may be more important than others. A good example is the communication between a CPU and a memory in a mobile device. A battery feeds a mobile device and the power consumption of the communication between the CPU and memory has a large impact on the battery life. When the device is wall-plugged, power consumption may be less of an issue, but the design needs to deal with the unplugged environment.

In most chip-to-chip, or device-to-device communication systems, communication takes place over a plurality of wires to increase the aggregate bandwidth. A single wire or a pair of these wires may be referred to as a channel or link and multiple channels create a communication bus between the electronic components.

The difficulty in designing high speed, low power and pin-efficient chip-to-chip or device-to-device communication systems lies in part in the fact that the communication channel is not perfect. First, the physical wires will mutually disturb the signals transmitted on them and noise and interference will be added to the transmitted signals. Second, the electronic components used to implement the communication system may not be perfect and this may disturb the signals used for communication.

Some solutions to these problems are taught by Cronie I, Cronie II, SPM and SUPM respectively, showing, among other things, various methods based on Orthogonal Differential Vector Signaling, Permutation Modulation Codes, Sparse Signaling Codes, Superposition Signaling Codes to further optimize the tradeoff between power consumption, pin efficiency and noise robustness of chip-to-chip communication systems. A common theme in Cronie I, Cronie II, SPM and SUPM is that the modulation methods and/or coding methods are designed for typically more than two wires. In this disclosure we refer collectively to the methods disclosed in Cronie I, Cronie II, SPM, SUPM and similar extensions as vector signaling methods, as opposed to "traditional" or "conventional" signaling methods which are designed for one or two wires at a time. The present invention also applies to prior art vector signaling methods not covered by Cronie I, Cornie II, SPM, or SUPM, as for example stipulated in U.S. Pat. No. 6,661,355 by Cornelius and Althas (hereinafter referred to as "Cornelius") or U.S. Pat. No. 6,556,628 by Poulton et al. (hereinafter referred to as "Poulton"). While vector signaling already provides substantial improvements regarding the tradeoff of pin-efficiency, power efficiency and noise resilience as compared to other approaches, there are some applications wherein additional improvements are possible, and sometimes may be necessary. For instance, in very high-speed communication systems, further resilience may be required to combat inter-symbol interference ("ISI") and crosstalk noise. Therefore dedicated equalization has to be performed at the receiver side. Prior art equalization methods for a chip-to-chip communication system are based on conventional signaling methods and are not adapted to maintain the advantages of vector signaling methods. Therefore, what is needed is an equalization method that further optimizes the communication system's power efficiency and noise resilience tradeoffs while still benefiting from the substantial pin-efficiency improvement brought by permutation modulation codes and sparse signaling codes or other vector signaling methods that operate on more than two bus wires. Such an equalization method is disclosed in this application and embodiments of the invention are directed towards solving these and other problems individually and collectively.

BRIEF SUMMARY

Equalization methods and apparatuses for equalizing vector signaling samples against various types of transmission channel noise and in particular inter-symbol interference noise are disclosed. In one embodiment, a rank-order equalizer comprises at least a rank-order unit, a coefficient selector and a subtraction unit. In another embodiment, a series of rank-order units are serialized into a rank-order equalizer unit in order to equalize several vector signaling samples. In a possible embodiment, several rank-order equalizer units further operate in parallel in a feed-forward mode of operation. In another possible embodiment, several rank-order equalizer units operate, in series, in a feedback mode of operation. The proposed equalization methods operate on all transmission wires simultaneously, as opposed to prior art equalization methods and therefore preserve the vector signaling advantages in terms of power consumption, circuit integration size and conventional noise robustness, while providing substantial further robustness to inter-symbol interference and crosstalk noise as required by ultra high speed transmission applications.

DETAILED DESCRIPTION

Figure 1:
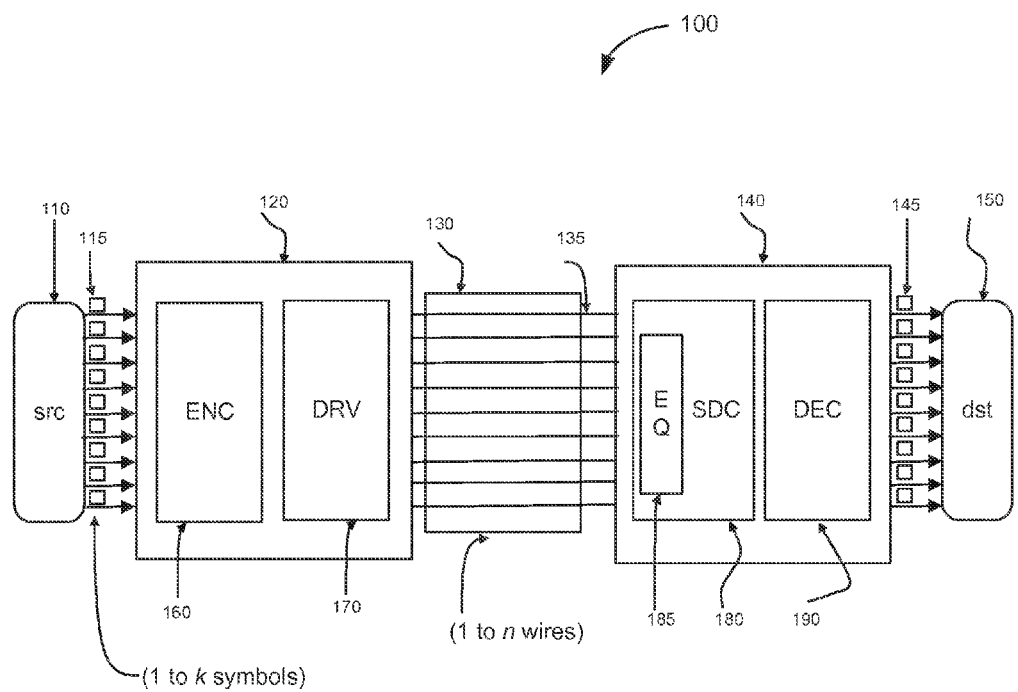
FIG. 1 depicts a high-level block diagram of a prior art communication system over which the present invention, or a conventional equalization method might be used.

FIG. 1 is a high-level block diagram of a prior art communication system over which the present invention or a conventional equalization method might be used. With such a system, there are multiple wires of the bus and signals are sent over those multiple wires, typically at a periodic rate. Thus, an information source 110 might provide a sequence of k information symbols 115 per period to a transmit unit 120, where the period might be measured as a time interval of T seconds. In preferred embodiments, T is smaller than one and the transmit unit can transmit the information content of k/T symbols per second. In some embodiments of the present invention, the information symbols may be bits, but other digital representations of information symbols as described above are also permissible.

The information bits 115 are fed to transmit unit 120. The task of the transmit unit 120 is to transform these bits into a set of physical signals that can be transmitted on the wires of bus 130 comprising n physical wires 135. At the other side of the bus 130, a receive unit 140 maps the received signals back to information bits 145. These information bits 145 are forwarded to the information destination 150. In some applications, the information destination may be co-located with the receive unit 140. One of moderate skill in the art will recognize that the system of FIG. 1 may be extended to bi-directional communication settings.

An example of such a communication bus 130 is, for example, a bus between a processor and memory. In this case the physical wires may take the form of striplines or microstrips on a PCB. Another example of a communication bus 130 is a set of wires connecting two different devices.

In this disclosure, most of the examples refer to communication buses where the wires carry electrical signals. However one of ordinary skill in the art, upon reading this disclosure, should recognize that the methods disclosed below are not limited to electrical signals only. The methods may readily be applied in other settings, such as those of optical communications.

As used here, pin-efficiency of a chip-to-chip communication system refers to a ratio of the number of bits, k, transmitted in each time interval and the number, n, of physical wires used to transmit those bits. In the case of optical channels, wires might be replaced by fiber or other media.

In a system according to that illustration, in accordance with the teachings of Cronie I, Cronie II, SPM and SUPM, at the transmitter side the transmit unit 120 comprises a vector signal encoder 160 and a bus driver 170. At the receiver side, the receive unit 140 comprises a bus receiver in the form of a signal-to-digital converter ("SDC") 180 and a vector signal decoder 190. As mentioned above, the transmitter may also employ other types of vector signaling methods, such as those stipulated in Cornelius or Poulton.

Detailed embodiments of systems where k=4 bits and n=5 wires ("4b5w") or k=8 and n=8 ("8b8w") respectively are taught by SPM. For the sake of an illustrative example, the communication bus 130 shown in FIG. 1 comprises n=8 wires to transmit k=8 bits as would be the case for the "8b8w" system, but other embodiments are also possible.

In FIG. 1, the information source 110 supplies a sequence of k bits every T seconds to the vector signal encoder 160. In the i-th time interval of T seconds, the vector signal encoder maps these k bits to a vector ci of size n. Various vector signal encoders may be applied, where the vector ci may be a code word from a permutation modulation code, a sparse signaling code, a superposition signaling code, or any code word of a vector signaling method. For instance, the methods taught by Cronie II, SPM and SUPM respectively may be used to perform this encoding, as well as other similar methods known to those skilled in the art.

The vector ci is then supplied to the bus driver 170 that generates a sequence of n continuous signals x1(t) to xn(t) for each of the n bus wires 1, ..., n in 135. In a preferred embodiment, for each single wire j, $1 \leq j \leq n$, serial pulse-amplitude modulation ("PAM") may be used to modulate the message ci[j], wherein ci[j] is the j-th component of the vector ci. In the general case, time is divided into periods of T seconds where T is the symbol length in seconds, i.e., the duration of time in which a symbol is transmitted over the collective set of wires 130, and for each i-th period T and on each of n wires, some signal of some pulse shape is conveyed according to the code word or code words used for the period. Thus, globally, a form of vector pulse amplitude modulation is applied by the bus driver 170. The corresponding transmitted waveform x(t) can be described as in Equation 1, where p(t) is a pulse shape and x(t) is a vector signal where the j-th component of x(t) is the signal transmitted on the j-th individual wire of the bus. The pulse shape p(t) may be chosen according to the application.

$$x(t) = \sum_i c_i p(t - iT) \quad \text{(Eqn. 1)}$$

Figure 2:
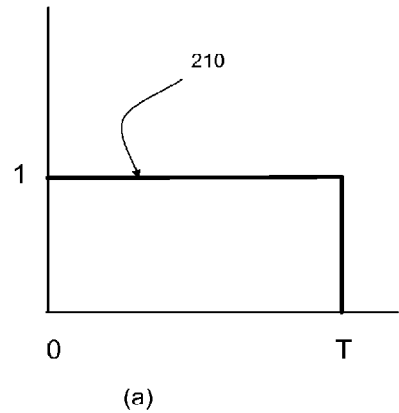
FIG. 2 represents various pulse shape signals as known in the prior art.
Figure 2:
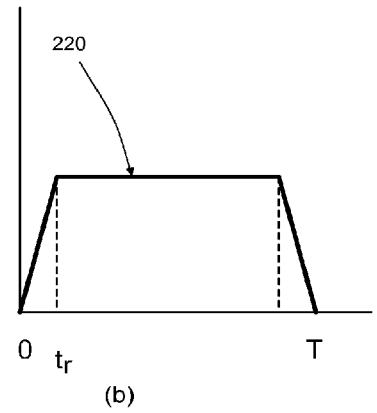
Figure 2:
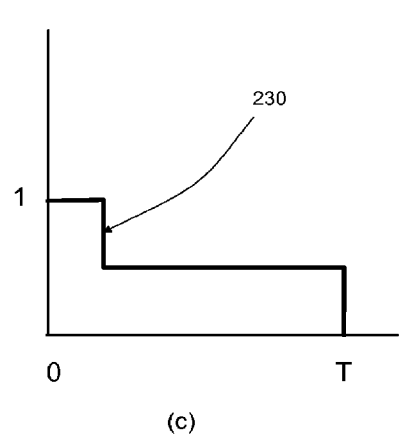
Figure 2:
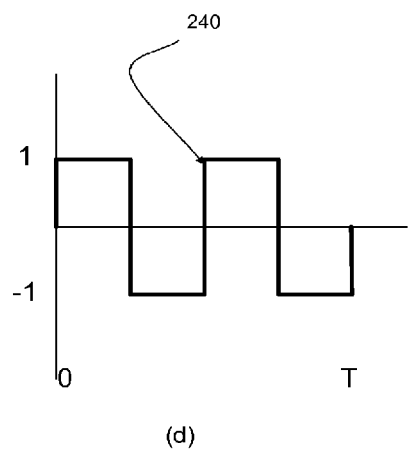

FIG. 2 illustrates several examples of pulse shape functions p(t): a square pulse shape 210 (FIG. 2(a)), a pulse shape 220 (FIG. 2(b)) with a finite rise and fall time $t_r$, a pulse shape 230 (FIG. 2(c)) that includes pre-emphasis, and a periodic square pulse shape 240 (FIG. 2(d)). As one of ordinary skill in the art will recognize, the pulse shape 220 may show improved crosstalk performance compared to the square pulse shape 210. Furthermore, the pulse shape with pre-emphasis 230 may be used to combat high frequency losses. Several other pulse shapes p(t), not illustrated in FIG. 2, may be used as well, as one of ordinary skill in the art will recognize.

In the example illustrated, the signals $x_1(t)$ to $x_n(t)$ may be transmitted by bus driver 170 as currents or voltages on the wires of the bus. These currents or voltages induce electromagnetic waves that traverse the bus. Bus driver 170 may also perform additional tasks, such as amplification, pre-emphasis, equalization, and filtering before actual transmission on the bus. At the receiver side, a set of signals $y_1(t)$ to $y_n(t)$ is present which may have been sensed by the SDC 180.

In the presence of noise or other signal alterations, a set of signals y1(t) to yn(t) might not exactly equal the corresponding signals x1(t) to xn(t). One cause for this may be the distortion caused by the frequency selectivity of the channel itself. Where h(t) denotes the impulse response of the channel which we assume to be the same for each signal path/wire i, and in the simple case where there is no crosstalk between the wires, each one of the received signals yi(t) can be written as the convolution of the transmitted signal xi(t) with the impulse response of the channel, as in Equation 2, wherein * denotes the convolution operator, yi(t) and xi(t) denote the i-th component of vector y and vector x, respectively, transmitted over the i-th wire at time t. Typically h(t) is only non-zero during a finite time interval called the "support" of h(t). The length of the support of h(t) is measured in multiples L of the symbol duration T. In many chip-to-chip communication systems the received signal is sampled. In this case the sample obtained in the k-th timeslot at the i-th wire can be expressed as in Equation 3.

$$y_i(t) = h(t) * x_i(t) \quad \text{(Eqn. 2)}$$

$$y_{i,k} = \sum_{j=0}^{L-1} h_j c_{i,k-j} \quad \text{(Eqn. 3)}$$

In Equation 3, $h_j$ is the value of h(t) sampled in the j-th timeslot. For a non-ideal channel, the length L of the pulse shape is larger than 1, so there are multiple overlaps of symbols at each sampling moment k, causing inter-symbol interference ("ISI"), which can induce errors in the symbol detection at the receiver side.

In the circuit shown in FIG. 1, the task of the SDC 180 is to provide a reconstruction of the original vector $x_k$ to the vector signal decoder 190. Possible embodiments of the SDC 180 and the decode unit 190 have been taught in SPM where a rank-order ("RO") unit is used to reconstruct the signal. In the general case, a rank-order unit determines the rank-order of its input components, that is, an indication of the relative ranks of the individual components of the vector. This rank-order may be a full rank-order which amounts to sorting, or it can be a partial rank-order which may amount to finding some largest values and some smallest values. In one embodiment, in accordance with the teachings by SPM, the transmitted vector Ck may be a sparse code word, meaning that it has few non-zero coordinates, and is completely specified by the locations of its non-zero coordinates, so the rank-order units may only have to output the ranking of these positions.

Figure 3:
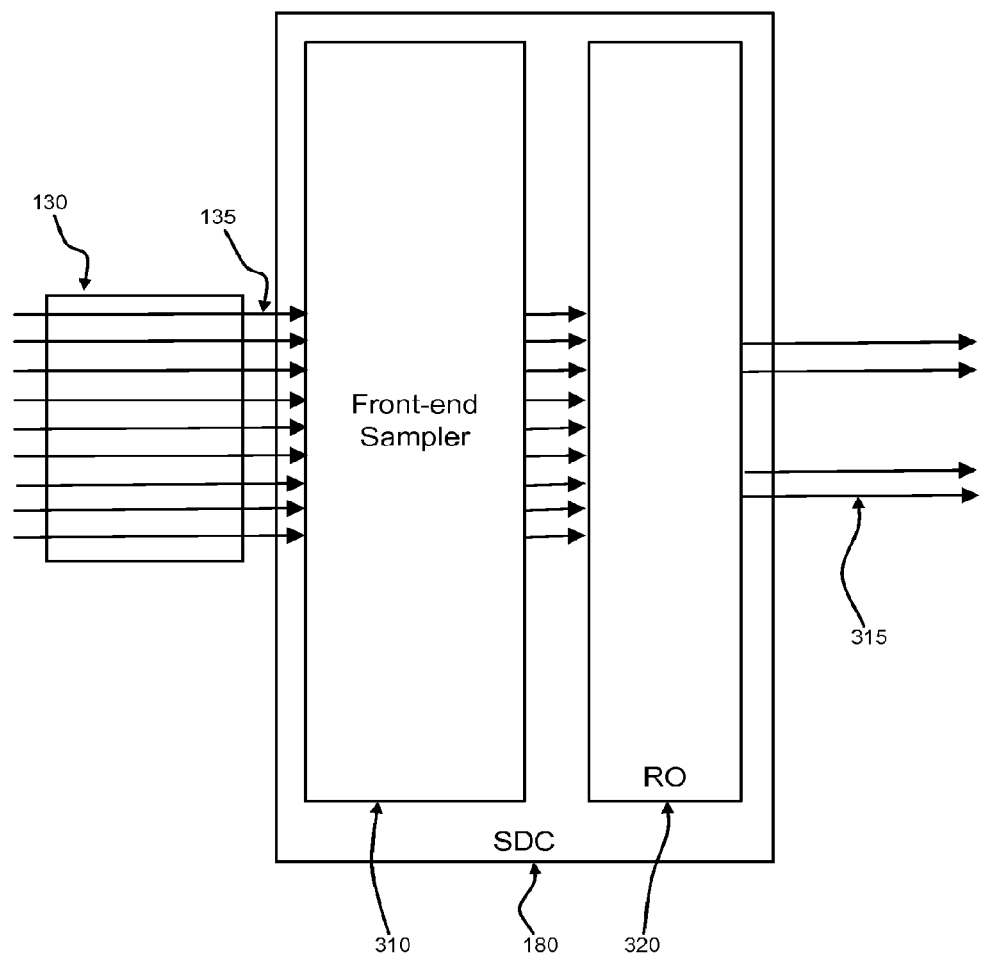
FIG. 3 shows a signal-to-digital converter unit for vector signaling without an equalizer, as known in the prior art.

FIG. 3 represents a possible embodiment of the proposed SDC 180 in the case of the 8b8w SPM vector signaling. A communication channel 130 comprises a set of n wires 135 where n is typically larger than two. The front-end sampler 310 samples the received vector signal y(t) at sampling time k to generate the vector of samples xk. The sampled vector xk is further input into a rank-order unit 320. For purposes of illustration, in the 8b8w signaling plotted in FIG. 3 as taught by SPM, the output of the rank-order unit 310 comprises four indices 315 indicating the ranking of the wires where respectively the two largest (+1, +1) and the two smallest sample values (−1, −1) have been measured (in the 8b8w case, the four other wire samples correspond to a zero value and are quiescent). The ranking operation may determine a full ordering of the sampled values on the wires, or it may indicate a partial order. A full ordering would mean that the values on the n wires are sorted. A partial ordering would mean that the wires are determined that carry some of the largest and some of the smallest values. As an example, consider the four sampled values y1, k, ..., y4, k as defined in Table 1.

TABLE 1

Values of the samples $y_{1,k}, \ldots, y_{4,k}$ for an example of the rank-order operation.

| i | $Y_{i,k}$ |
|---|---|
| 1 | 0.54 |
| 2 | 0.93 |
| 3 | −0.23 |
| 4 | 1.12 |

A full rank operation on the values $y_{i,k}, \ldots, y_{4,k}$ may determine the ranking by applying a sorting operation. The full rank-order operation may, for instance, return the integers 4, 2, 1, 3 indicating that $y_{4,k}$ is the largest value, $y_{2,k}$ is the second largest value, etc. A partial rank-order operation on the values $y_{i,k}, \ldots, y_{4,k}$ may find the largest and smallest values. In this case, the rank-order operation may return the integers 4 and 3 indicating that the largest value is $y_{4,k}$ and the smallest value is $y_{3,k}$.

Possible detailed embodiments of the rank-order units 320 and the decode unit 190 have been taught in SPM. For instance, in some embodiments, the rank-order units 320 may further comprise a max-detector unit to select the largest (positive) values and a min-detector unit to select the smallest (negative) values out of the n components of the sample $dx_k$ vector signal. As will be recognized by one skilled in the art, other embodiments of rank-order units are also possible.

When the channel induces too much ISI and/or crosstalk noise, for instance in ultra high-speed chip-to-chip communication applications, the straightforward rank-order unit decision may not be reliable enough for the rank-order unit 320 to accurately sort the values that uniquely characterize the received vector signal; so further equalization is needed at the side of the receive unit 140. This equalization is performed by an equalizer unit 185 as part of the SDC processing unit 180 in FIG. 1. In addition to equalization, the SDC 180 may perform additional tasks, such as amplification, filtering and other operations that improve upon the quality of the received signals.

Decision feedback equalization ("DFE") is known to those skilled in the art as a way to use the detector decisions at previous time instances to eliminate the ISI on current pulse demodulation, but it suffers from two major limitations. First, if noise and residual ISI are large, significant error propagation remains—for instance, 100 ms propagation at 10 Gbit/s still represent 1 Gbit of erroneous data at the destination. Second, the timing of ISI subtraction is critical—at 10 Gbit/s, only 100 picoseconds separate the current symbol detection from the next one, and the immediate symbol neighbor feedback operation must be achieved within this time interval. While prior art decision feedback equalization typically operates independently on each wire, in contrast, the proposed equalizer comprises at least a component that operates accordingly on the full set of n input wire signals. The various embodiments of enhanced equalization methods proposed herein address all those issues as will now be explained in further detail.

First Embodiments of Rank-Order Equalization

Figure 4:
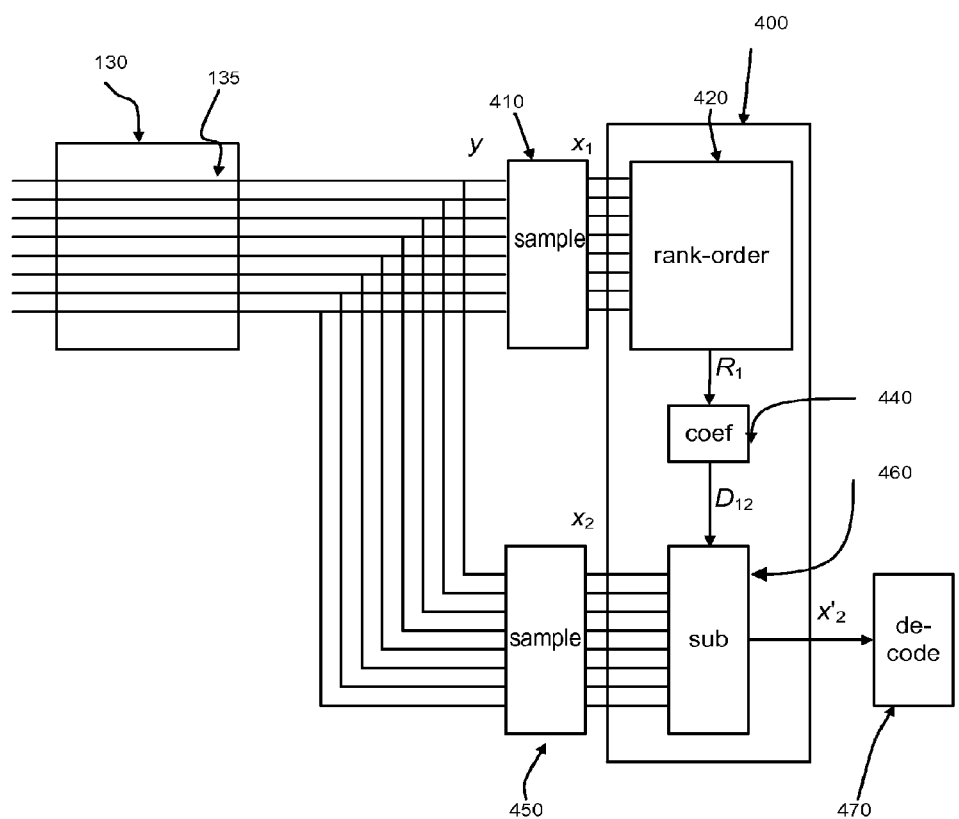
FIG. 4 shows a rank-order equalization unit of depth 2 according to the present invention.

A first embodiment of a rank-order equalization unit 400 is now further described with reference to FIG. 4. A first sample unit 410 takes a set of samples of the waveforms $y_1(t), \ldots, y_n(t)$ present at the wires 135 of the communication bus 130 at a time instance $T_1$. FIG. 4 exemplifies a communication bus 130 that comprises eight wires 135, but other embodiments are possible. A second sampler unit 450 takes another set of samples at time instance $T_2$. In preferred embodiments, $T_1$ and $T_2$ are distinct times and $T_1 < T_2$. In other embodiments the sample times for the different wires i are not equal but may be taken differently as $T_{1,i}, T_{2,i}$. In some embodiments the sampling time instances $T_1, T_2$ may be uniformly spaced and in some embodiments the sampling spacing may be non-uniform.

The proposed rank-order equalization unit 400 comprises at least a rank-order unit 420, a coefficient selector 440 and a subtraction unit 460. The rank-order unit 420 determines the ranking of the samples taken by the first sampler 410. The rank-order unit 420 may be determined by performing a full sorting operation of the samples. In some embodiments, one may use the properties of the signaling method that are used on the bus 130 to reduce the sorting operation to a simpler operation, for instance, in the case of sparse signaling as taught by SPM.

The coefficient selector 440 combines the result of the rank-order unit with a set of coefficients matching the channel and/or the vector signaling properties to derive a set of corrected coordinates, such as permuted coordinates. The coefficient selector 440 uses the result of the rank-order unit to select a set of coefficients. A simple embodiment of the coefficient selector 440 is a lookup table. Other embodiments are also possible. As will be recognized by one skilled in the art upon further review of this invention, in the case of sparse signaling where the code word is fully determined by its subset of non-quiescent components, as taught for instance by SPM, the coefficient selector 440 may be optimized accordingly.

The subtraction unit 460 then subtracts the resulting set of coefficients from the samples taken by the second sample unit 450. The result may then be transmitted to a decode unit 470 that performs a final detection of the data that is transmitted, or to another rank-order unit. The operation of the components is now described in further detail.

In the illustrated embodiment of FIG. 4 and the subsequent discussions, it is assumed that bus 130 has 8 wires, but this is for illustrative purposes only and is not meant to restrict the usage of the methods. In particular, as will be clear to those of skill in the art, the methods explained will be applicable to all vector signaling methods taught in Cronie I, Cronie II, SPM, and SUPM. The first sample unit 410 operates at time instance $T_1$ and the second sample unit 450 operates at time instance $T_2$, and the input to the sample units 410 and 450 at time t are the signals $y_1(t), \ldots, y_8(t)$. The sample unit 410 generates a vector of samples $x_1$ as in Equation 4 and the sample unit 450 generates a vector of samples $x_2$ as in Equation 5.

$$x_1 = [y_1(T_1) y_2(T_1) y_3(T_1) y_4(T_1) y_5(T_1) y_6(T_1) y_7(T_1) y_8(T_1)] \quad \text{(Eqn. 4)}$$

$$x_2 = [y_1(T_2) y_2(T_2) y_3(T_2) y_4(T_2) y_5(T_2) y_6(T_2) y_7(T_2) y_8(T_2)] \quad \text{(Eqn. 5)}$$

The j-th element of $x_1$ and $x_2$ is denoted by $x_1[j]$ and $x_2[j]$, respectively. The rank-order unit 420 determines the ranking of the sample vector $x_1$. The ranking that is generated by rank-order unit 420 may be defined by a vector of integers $R_1$ where its first element $R_1[1]$ is such that $x_1[R_1[1]]$ is the largest value of the sample vector $x_1$. In general, the j-th element of $R_1$ is equal to the position of the j-th largest element of $x_1$. As one of moderate skill in the art will recognize, there are several other ways to define a rank-ordering of a vector of samples, and the invention taught herein is equally applicable to all such ways after obvious modifications.

The coefficient selector 440 comprises a set of eight coefficients $C_{12}$. In preferred embodiments, the coefficients $C_{12}$ are chosen according to the channel and/or vector signaling method used. In one embodiment, all these coefficients are pre-determined, but in some further embodiments, some or all of these coefficients may be computed on the fly. Based on the ranking performed by rank-order unit 420, the coefficient selector 440 generates a vector of coefficients $D_{12}$, where the j-th element of $D_{12}$ is set to $D_{12}[j] = C_{12}[R_1[j]]$. In one embodiment, a permutation of the vector of coefficients $C_{12}$ is generated. The subtraction unit 460 subtracts the resulting vector of permuted coefficients $D_{12}$ from the second sample vector $x_2$ to generate a vector of corrected samples as in Equation 6.

$$x'_2 = x_2 - D_{12} \quad \text{(Eqn. 6)}$$

In FIG. 4, the resulting vector of samples $x_2'$ is input to decode unit 470 that performs the final decision and recovers the data.

In preferred embodiments, the coefficient vector $C_{12}$ may contain only few non-zero elements. This has the advantage that for these elements, the subtraction unit 460 does not have to be implemented. In some systems, the vector coding method that is used over the bus 130 is chosen such that the equalization performance is good with only few non-zero elements in $C_{12}$.

In practice, the first embodiment as exemplified in FIG. 4 may be further optimized to operate in a very effective manner when the channel is prone to significant ISI, as will now be further described with reference to FIG. 5.

Figure 5:
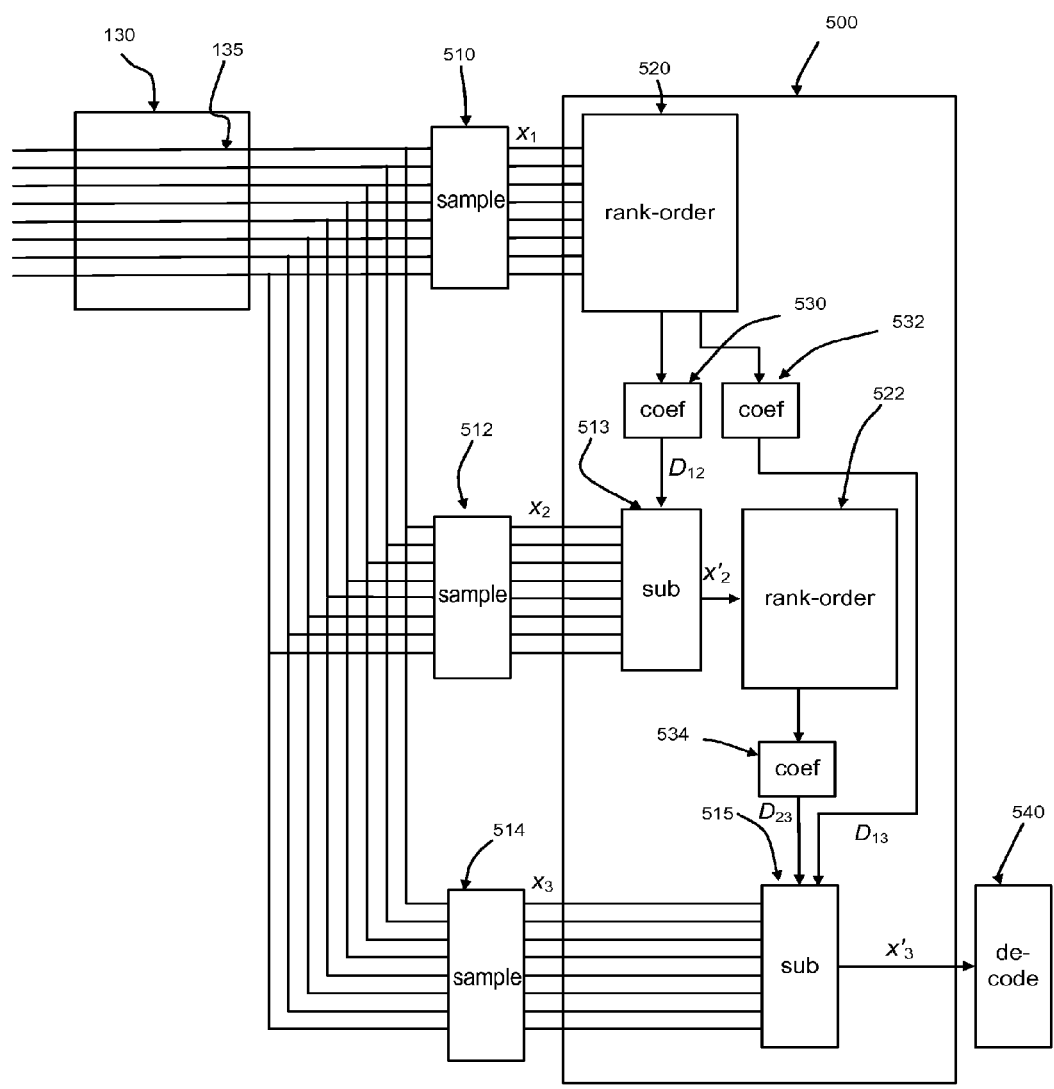
FIG. 5 shows a rank-order equalization unit of depth 3 according to the present invention.

FIG. 5 shows a rank-order equalization unit 500 further comprising a series of rank-order units 520, 522, coefficient selectors 530, 532, 534 and subtraction units 513, 515. The result of the first rank-order unit is used to equalize both the second and the third sample, and the result of the second rank-order unit is used to equalize the third sample. The communication bus 130 comprises eight wires 135. A set of three sample units 510, 512 and 514 samples the eight input waveforms at time instances $T_1$, $T_2$ and $T_3$ respectively. In preferred embodiments, $T_1$, $T_2$ and $T_3$ are distinct and may be ordered according to $T_1 < T_2 < T_3$. The input to the sample units 510, 512 and 514 at time t is represented by the signals $y_1(t), \ldots, y_8(t)$. The sample unit 510 generates a vector of samples $x_1$ as in Equation 7, the sample unit 512 generates a vector of samples $x_2$ as in Equation 8, and the sample unit 514 generates a vector of samples $x_3$ as in Equation 9.

$$x_1 = [y_1(T_1) y_2(T_1) y_3(T_1) y_4(T_1) y_5(T_1) y_6(T_1) y_7(T_1) y_8(T_1)] \quad \text{(Eqn. 7)}$$

$$x_2 = [y_1(T_2) y_2(T_2) y_3(T_2) y_4(T_2) y_5(T_2) y_6(T_2) y_7(T_2) y_8(T_2)] \quad \text{(Eqn. 8)}$$

$$x_3 = [y_1(T_3) y_2(T_3) y_3(T_3) y_4(T_3) y_5(T_3) y_6(T_3) y_7(T_3) y_8(T_3)] \quad \text{(Eqn. 9)}$$

The first rank-order unit 520 takes as input the sample vector $x_1$ and determines its ranking. The ranking generated by rank-order unit 520 may be defined by a vector of integers $R_1$. The result of the ranking performed by rank-order unit 520 is used by coefficient units 530 and 532. Each coefficient unit 530, 532 comprises a vector of coefficients $C_{12}$, $C_{13}$, respectively. Each coefficient unit 530, 532 uses the result of the rank-ordering performed by 520 to generate a vector of coefficients $D_{12}$, $D_{13}$ respectively. The j-th element of the $D_{12}$ and $D_{13}$ vectors is generated as in Equation 10.

$$D_{12}[j] = C_{12}[R_1[j]]$$

$$D_{13}[j] = C_{13}[R_1[j]] \quad \text{(Eqn. 10)}$$

The subtraction unit 513 subtracts $D_{12}$ from the vector of samples $x_2$ generated by the second sample unit 512:

$$x_2' = x_2 - D_{12}$$

and transmits the resulting vector $x_2'$ to the second rank-order unit 522. The second rank-order unit subsequently performs a rank-ordering on the resulting vector $x_2'$. The ranking generated by rank-order unit 522 may be defined by a vector of integers $R_2$. The coefficient unit 534 comprises a vector of coefficients $C_{23}$. The output $R_2$ of the second rank-order 522 is used by the coefficient unit 534 to generate a vector of coefficients $D_{23}$ as in Equation 11.

$$D_{23}[j] = C_{23}[R_2[j]] \quad \text{(Eqn. 11)}$$

The subtraction unit 515 subtracts both $D_{13}$ and $D_{23}$ from the vector of samples $x_3$ generated by the third sample unit 514 to generate the vector $x_3'$ as in Equation 12.

$$x_3' = x_3 - D_{13} - D_{23} \quad \text{(Eqn. 12)}$$

The resulting vector of samples $x_3'$ is input to decode unit 540 that performs the final decision and recovers the data. The advantage of this method is that the resulting ranking estimation of the components of the vector $x_3'$ integrates a progressive correction by the coefficient units to avoid the noise and residual ISI error propagation.

In the more general case, we define the depth of the rank-order order equalization unit as the number of samples it operates upon. Thus the rank-order equalization unit depicted in FIG. 4 has a depth of 2 and the rank-order equalization unit depicted in FIG. 5 has a depth of 3. The depth is denoted by D. A generalized rank-order equalization ("ROE") unit according to a preferred embodiment comprises D−1 rank-order units $RO_1, RO_2, \ldots RO_{D-1}$. The first sample $x_1$ of a series of D samples $x_1, x_2, \ldots, x_D$ is input to the first rank-order unit $RO_1$. The output $R_i$ of the i-th rank-order unit $RO_i$ is used to select n vectors of coefficients $D_{ij}$, for $j=i+1, \ldots, D-1$. Each coefficient vector $D_{ij}$ is then used to equalize the j-th vector sample $x_j$ by subtracting it from sample $x_1$. Each intermediate equalized sample $x_j'$ is input into the j-th rank-order unit $RO_j$. The last equalized sample $x_D'$ then provides the estimated code word output from the ROE unit and can be input into the decoder unit.

In practice, the choice of the ROE depth is made by trading off the ISI robustness, depending on the application channel properties, and the implementation cost, as the more samples are processed and progressively corrected by the rank-order estimations, the more reliable the final equalized decoding by the decode unit 470, respectively 540 will become, but the more rank-order processing components 420, respectively 520, 522 and coefficient units 440, respectively 530, 532, 534 have to be integrated into the rank-order equalization unit.

As will be apparent to one skilled in the art, the proposed rank-ordering equalization leads to substantial improvements, both in terms of power efficiency and equalization performance, over conventional equalization methods when applied to vector signaling.

Example of Rank-Order Equalization for a Depth of 3

Figure 6:
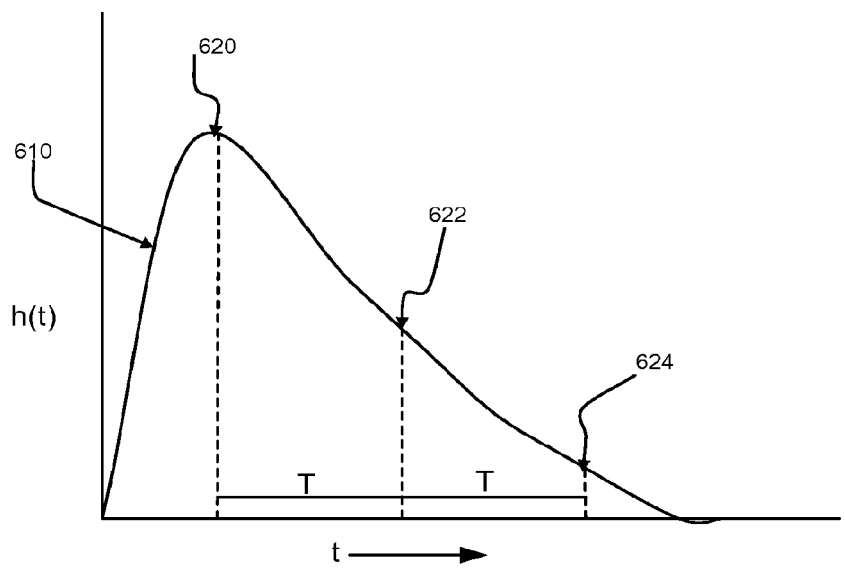
FIG. 6 shows a possible representation of the impulse response h(t) used to model the signal transfer over each bus wire.

For the purpose of illustration, a practical example of rank-order equalization is now further described. The communication bus may comprise eight wires and the 8b8w code as taught in SPM may be employed in accordance with the formerly described embodiment as shown in FIG. 5. It is assumed that the frequency response for each wire is the same and a negligible amount of crosstalk is present. One of skill in the art will recognize that this is in no way limiting. Different responses per wire can also be handled and crosstalk may be taken into account as well. FIG. 6 shows a possible impulse response h(t) that defines the transfer of each wire. The sample units 510, 512 and 514 may operate at a rate of 1/T samples/second, which gives a time spacing between samples of T seconds. In chip-to-chip communication systems, the value of T could be, for instance, 64 ps. The main tap or value 620 is assumed to be normalized to 1. The values $h_1$ and $h_2$ of the second tap 622 and 624 are defined in Table 2.

TABLE 2

Values of the impulse response sampled at 1/T Hz.

| Tap | value |
| --- | --- |
| $h_0$ | 1.00 |
| $h_1$ | 0.48 |
| $h_2$ | 0.12 |

At each sample interval k, the sampled value at wire i is given by Equation 13.

$$y_{i,k} = h_0 c_{i,k} + h_1 c_{i,k-1} + h_2 c_{i,k-2} \quad \text{(Eqn. 13)}$$

In the k-th time interval, the transmitted word from the 8b8w code ($c_0$) is severely hit by inter-symbol interference. In Equation 13, $c_{i,k}$ denotes the value of the code word transmitted at wire i in the k-th timeslot. For example, FIG. 7, graph 710, shows a histogram of the value of $y_{i,k}$ during the k-th time interval for many (10000) randomly chosen code words from the 8b8w code transmitted over a communication bus for which the transfer of each wire is defined by h(t).

Figure 7:
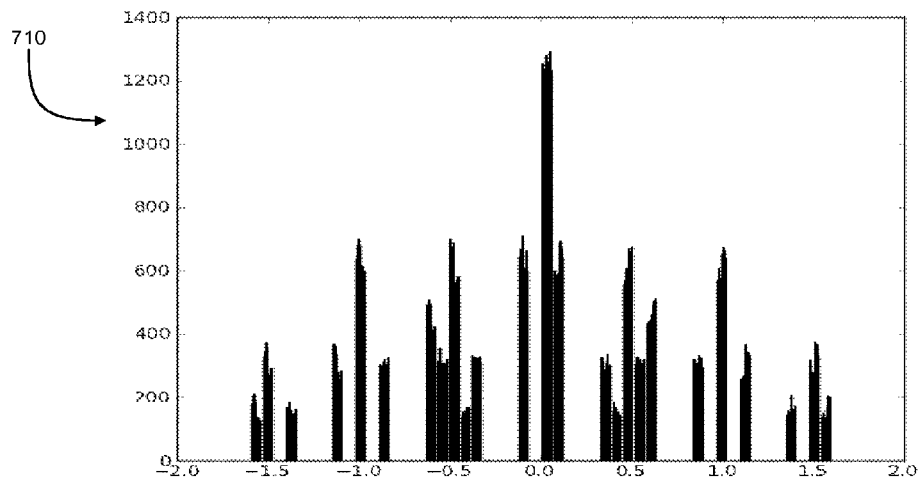
FIG. 7 shows the distribution of a symbol of a received code word with the channel of FIG. 6 when no rank-order equalization is applied.

In case of a perfect channel, the three possible levels of the code word of the 8b8w code would clearly be visible. However, as can be seen in FIG. 7, the three levels cannot be distinguished anymore which will result in many errors. In a possible embodiment, the rank-order equalization unit of FIG. 5 is used to perform equalization and the vectors of coefficients $C_{12}$, $C_{13}$ and $C_{23}$ may be chosen as shown in Equations 14-16.

$$C_{12} = [0.58 \; 0.38 \; 0 \; 0 \; 0 \; 0 \; -0.38 \; -0.58] \quad \text{(Eqn. 14)}$$

$$C_{13} = [0.15 \; 0.10 \; 0 \; 0 \; 0 \; 0 \; -0.10 \; -0.15] \quad \text{(Eqn. 15)}$$

$$C_{23} = [0.51 \; 0.45 \; 0 \; 0 \; 0 \; 0 \; -0.45 \; -0.51] \quad \text{(Eqn. 16)}$$

Figure 8:
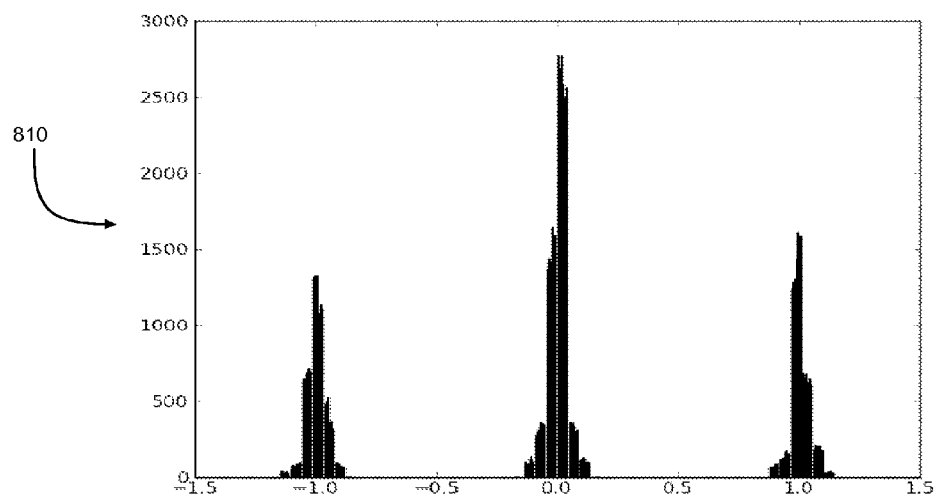
FIG. 8 shows the improved distribution of a symbol of a received code word with the channel of FIG. 6 when a rank-order equalization of depth 3 is applied.

A histogram of the values of one of the components of the resulting vector $x_3'$ is shown in FIG. 8 for many randomly chosen code words. As is clear from the figure, the three components of the estimated code words resulting from the proposed rank-order equalization are now clearly separated, increasing the noise immunity and decreasing the error rate due to Isi.

Modes of Operation

In ultra high-speed communication applications, the latency of the rank-ordering, coefficient selection and subtraction operations of the rank-order equalization unit according to the first embodiment disclosed herein may become more critical. Depending on the ISI conditions, the depth of the rank-order equalizer may be substantial for the decoder to be able to make a reliable decision. In some applications, it is therefore desirable to further enhance the first embodiment of the rank-ordering equalizer to further parallelize some of the rank-ordering equalization processing in an improved SDC 180 embodiment.

Various embodiments of enhanced equalization methods will now be described accordingly. The general principle of rank order equalization can be used in different settings. In a first setting, rank-order equalization is performed by taking several series of D successive vector samples consecutively and processing each series by rank-order estimation to make a decision on the last vector sample of each series. In this case, several of these units may be employed in parallel to guarantee processing of a continuous stream of data. This operational setting is referred to as feed-forward operation. In another setting, a single vector sample is processed serially by a series of rank-order equalization units and feedback is employed from one ROE to the other. In such a setting, the processing time required for rank-order processing may be more critical. However, the total latency may be reduced. Both modes of operation are described in more detail below.

Feed-Forward Operation

Figure 9:
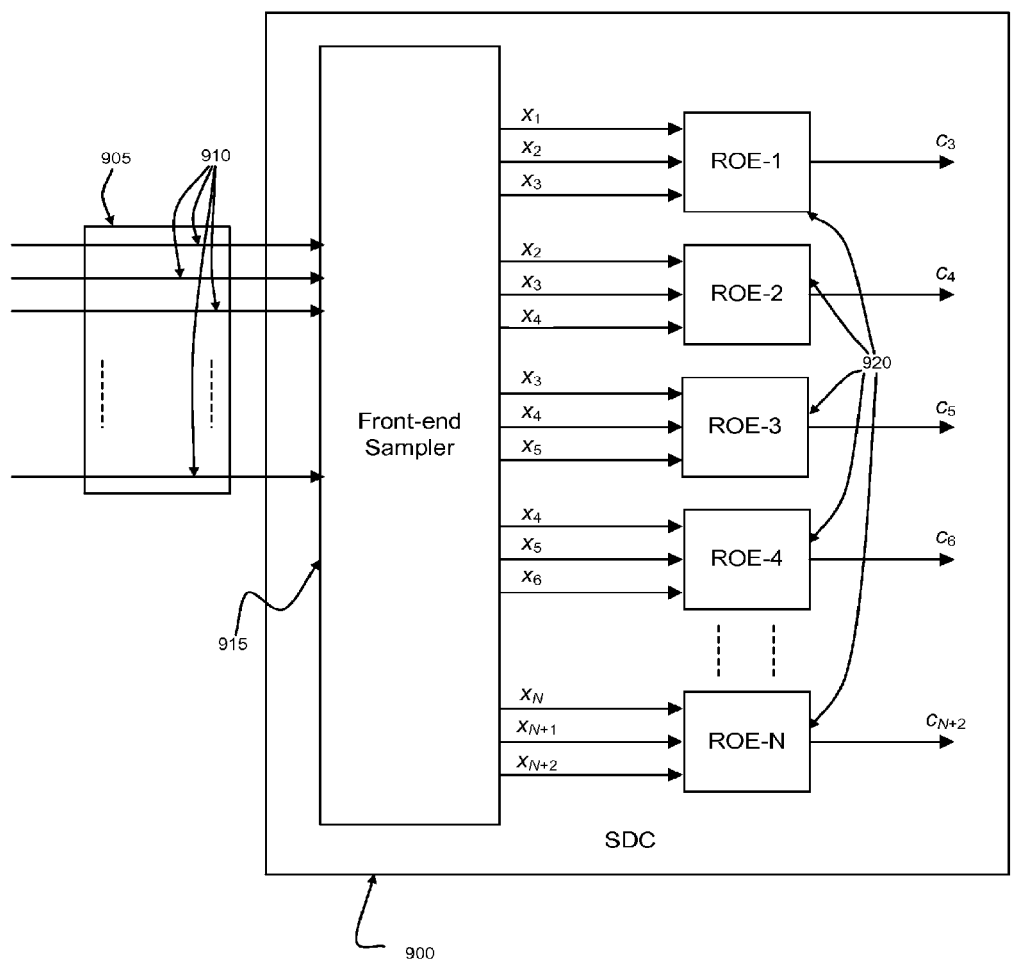
FIG. 9 shows a signal-to-digital converter adapted to support feed-forward rank-order equalization.

FIG. 9 shows an improved SDC 180 according to a possible embodiment. A communication bus 130 comprises n wires 135. The improved SDC 180 with feed-forward rank-order equalization comprises N rank-order equalization ("ROE") units 920. Each of the ROEs may implement the scheme exemplified in FIG. 5 and its corresponding embodiments, or a more general embodiment of the rank-order equalizer as formerly described. Each of the ROE units 920 operates on a set of D samples where D is the depth of the rank-order equalization. In FIG. 9, an example is shown where the ROE depth is D=3. A front-end sampler 910 samples the wires of the bus at N+D−1 different time instances. In the general case, the vectors of samples output by the front-end sampler 910 are denoted by $x_1, \ldots, x_{N+D-1}$. In the case illustrated in FIG. 9 where D=3, they are thus denoted by $x_1, \ldots, x_{N+2}$.

The first ROE unit has, as its input, the vector samples x1, x2, ..., xD and the i-th ROE unit has, as its input, the vector samples xi, xi+1, ..., xi+D−1. The output ci+D of the i-th ROE unit is an estimate for the code word from the vector signaling code that is transmitted over the bus 130.

The different ROE units 920 work independently, in parallel, on their respective input samples. However, as is clear from FIG. 9, any two consecutive ROE units of depth D=3 share D−1=2 of their three input vector samples. The required duplication of vector samples may be implemented in the front-end samplers. This can often be done without substantial additional complexity.

A substantial advantage of this feed forward equalization approach is that each of the ROE units can operate independently of the other ROE units. This means that there is no signal path between the different ROE units, which mitigates error propagation.

Another substantial advantage of this approach is that the number N of parallel ROE processing units can be optimized to minimize the overall SDC 180 response time. In the basic first embodiment of a single ROE unit ROE-1 of depth D, the ROE-1 unit is only available to process a new series of samples $x_{N+1}, x_{N+2}, \ldots, x_{N+D}$ after having processed a first series of D samples $x_1, x_2, \ldots, x_D$. By increasing N, the amount of time available to each ROE unit for the processing of the D samples may be increased.

Feedback Operation

Figure 10:
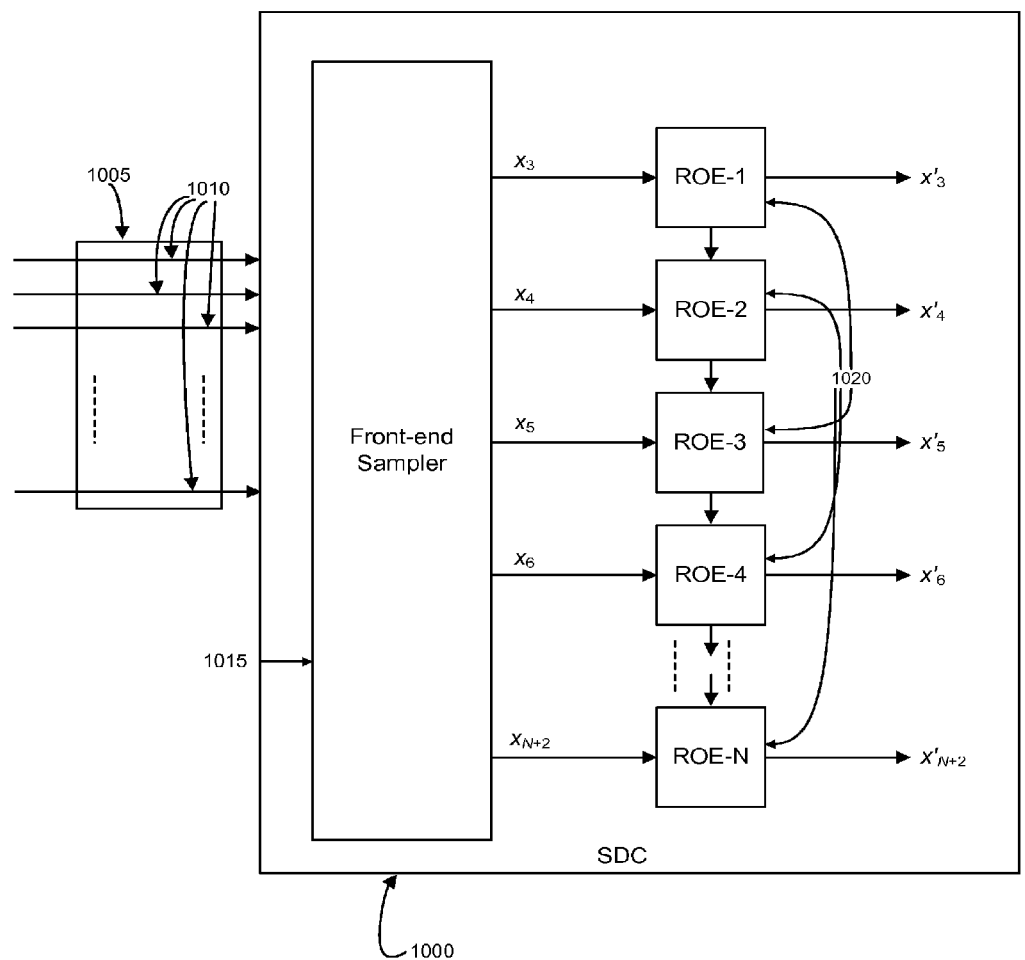
FIG. 10 shows a signal-to-digital converter adapted to support feedback rank-order equalization.

An alternate embodiment by means of a feedback mode of operation is possible too and will now be described in more detail. With reference to FIG. 10, the SDC 180 comprises a series of N rank-order equalizer units 1020 ROE-1, ROE-2, ..., ROE-N, that process the sequence of D vector samples $x_i$ for i=3, ..., N+2 to accelerate the overall feedback processing time. Each of the rank-order units has a single vector sample as its input. In FIG. 10, the result of ROE unit i is fed back to rank-order unit i+1. One may also choose to feedback the result of ROE unit i to all or some of the subsequent ROE units i+1, i+2, etc. to further improve the equalization capability.

The output of rank-order equalization unit ROE-i is taken into account by rank-order equalization unit ROE-i+1 as will now be further described in more detail. In one embodiment, an improved rank order feedback equalized estimation $x_{N+D-1}'$ is detected for the (N+D−1)-th sample vector by the last rank-order equalizer unit 390 ROE-N of depth D.

This possible embodiment will now be described step by step. For the sake of illustration, a ROE depth of D=2 is considered and the SDC 180 comprises N rank-order equalizer units 1020. The ROE units 1020 may be implemented in accordance with the former embodiment illustrated by FIG. 4.

The first rank-order equalization unit ROE-1 takes, as input sample, vectors $x_3$ and outputs a partially equalized estimation $x_3'$. The resulting estimation $x_3'$ already benefits from a rank-ordering equalization. The results of the ROE-1 unit are directly fed into the second rank-order equalizer ROE-2. The ROE-2 unit also has, as its input, the vector sample $x_4$. With the sample $x_4$ and results of unit ROE-1, the second rank-order equalization unit ROE-2 generates an equalized estimation $x_4'$ of $x_4$.

Other feedback modes of operation are possible as well. For instance, intermediate results such as the intermediate coefficients from one ROE unit may be fed back into the next ROE unit. In some embodiments, the coefficients of the ROE coefficient selectors are the same for each ROE unit. In other embodiments, the coefficients of the ROE coefficient selectors may vary for each ROE unit depending on its rank of operation in the serial equalization.

Determination of Coefficients for Rank-Order Equalization

Figure 11:
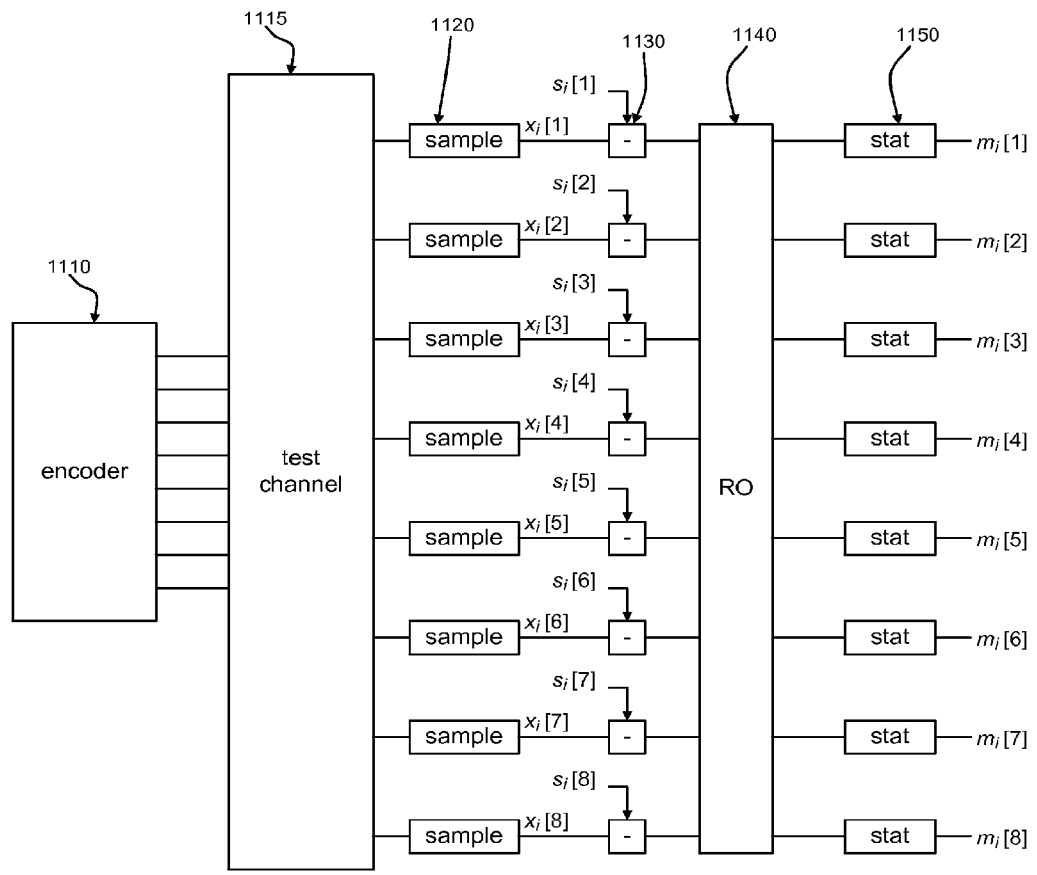
FIG. 11 shows a setup to determine coefficients for rank-order equalization.

A possible method to determine the coefficients to be used in rank-order equalization is now further described for a bus comprising eight wires with reference to FIG. 11. For the purpose of illustration, it is assumed that the response for each wire of the bus is defined by an impulse response h(t) that is the same for each wire. Furthermore, without loss of generality, it is assumed that there is no crosstalk between the wires. As one of skill in the art will recognize, the method can be extended to cases where crosstalk is present. The core idea is to determine the statistical properties of the ISI at the different stages in the rank-order equalization process. The statistics of the ISI are defined by a probability density function and the coefficients can be chosen as a functional of the probability density function. In preferred embodiments, the mean of the probability density function may be used as the coefficient. To determine the actual statistics of the ISI at the several stages of rank-order equalization, one may resort to an analytical derivation or a numerical simulation.

FIG. 11 illustrates a key component of a setup for the numerical simulation of the statistics of the ISI. An encoder 1110 generates random code words at the rate at which the channel is used. A test channel 1115 models the real-world channel in a sufficiently accurate manner. The outputs of the test channel 1115 are sampled by samplers 1120. From these samples, subtraction units 1130 subtract values and these values depend on the stage of the rank-order equalization for which the ISI statistics are to be determined Rank-order units 1140 rank the corresponding samples and statistics of the different ranks are determined by statistics units 1150.

For a rank-order equalizer with depth D, D−1 steps are required to determine the coefficients. In the first step, the sample units 1120 generate the samples $x_1[1], \ldots, x_1[8]$ at the sample moment T and the values of $s_1[1], \ldots, s_1[8]$ are equal to 0. The rank-order unit 1140 determines the ranking of the corrected samples $x_1[1]-s_1[1], [8]-s_1[8]$. The statistics units 1150 determine the distribution of the ranked samples. For instance, the first statistics unit may determine the distribution of the largest values, the second statistics unit may determine the distribution of the second largest value, etc. The statistics units 1150 output the mean values of the samples $x_1[1]-s_1[1], \ldots, x_1[8]-s_1[8]$ after ranking. These mean values are denoted by $m_1[1], \ldots, m_1[8]$ where $m_1[j]$ denotes the mean of the j-th largest corrected sample value. Now the first set of coefficients can be determined as in Equation 17.

$$C_{1,j}[k] = m_1[k] \cdot h((j+1)T) \quad \text{(Eqn. 17)}$$

In a similar way, the other coefficients may be determined. As one of skill in the art will recognize, depending on the criterion, there may be better methods to determine the coefficients. In preferred embodiments, a chip-to-chip communication system may employ adaptive methods to dynamically adapt the coefficients. Such an adaptive algorithm may collect statistics during the actual rank-ordering process and adapt the coefficients on the fly.

Some Advantages of Rank-Order Equalization

The above described embodiments mostly illustrate the use of rank-ordering equalization to increase the communication system robustness to inter-symbol interference while preserving the overall implementation efficiency of vector signaling methods in general and the sparse signaling codes in particular. As will be evident to those skilled in the art, the methods disclosed in this application may also be applied to other vector signaling methods such as superposition signaling codes.

A significant advantage of the proposed rank-ordering equalization of vector signaling over conventional equalization methods such as passive equalization is that it requires very little hardware and power consumption overhead, in particular when used in combination with sparse signaling codes. The proposed rank-ordering equalizer is particularly efficient to integrate into an IC design as it only requires the inclusion of coefficient selector and subtraction units into the vector signaling receiver circuitry. As known in the art, subtraction may be efficiently implemented by means of a charge redistribution circuitry or current mode circuitry. Capacitors may be used to buffer the intermediate step values in the multi-step rank-ordering feedback methods.

Another major advantage of the proposed rank-ordering equalization of vector signaling over conventional decision feedback equalization of differential signaling is that it applies equalization to all wires globally instead of individually on each wire. This improves the error resilience. Moreover, when using sparse signaling codes, a majority of the bus wires are quiescent and associated with zeros, as opposed to −1 and +1 pulse shaping, which also significantly reduces the overall sensitivity to ISI interference and facilitates the design of efficient equalization accordingly.

As the proposed rank-order equalization increases the end-to-end robustness to noise, it is possible to save some passive equalization steps at the transmitter side and consequently reduce the implementation cost associated with passive equalizers dedicated circuitry and/or power consumption. While the equalizer embodiment and equalization methods herein disclosed can primarily be applied at the receiver side, it is of course still possible to combine them with passive equalization at the transmitter side to get rid of any precursor ISI or at least cancel it as much as possible.

As the proposed rank-order equalization can be fine-tuned to facilitate the symbol separation at the receiver side, thanks to a careful channel modeling and choice of the equalization coefficient matrices, it may no longer be necessary to implement a traditional clock and data recovery method. This is by no means a prerequisite of the proposed methods; however, it is of course still possible, and desirable in certain embodiments of the present invention, to combine the proposed rank-ordering equalization with various clock and data recovery methods.

Other Applications

Figure 12:
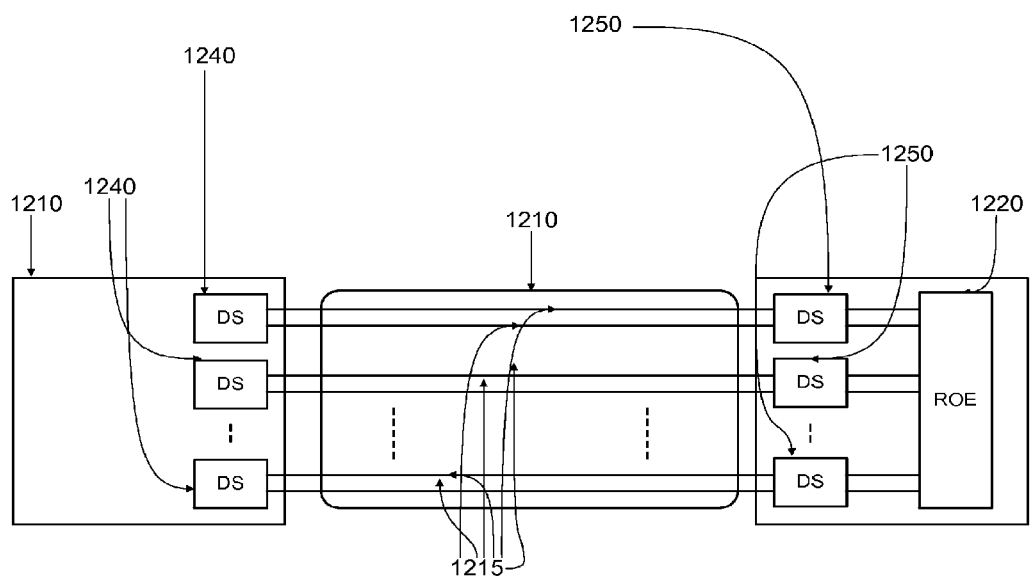
FIG. 12 shows a chip-to-chip communication system based on multiple lanes of differential signaling employing the current invention.

The concept of rank-order equalization may also be used in chip-to-chip communication systems based on other signaling methods. In a preferred embodiment, rank-order equalization is applied in a chip-to-chip communication system that uses differential signaling and operates on multiple lanes. In other preferred embodiments, rank-order equalization may be used in systems employing constant weight codes, limited weight codes or bus inversion coding. An embodiment of multiple differential lanes is now further described with reference to FIG. 12. FIG. 12 shows a communication bus 130 that comprises 2n wires 135. Each pair of wires is driven by a differential driver 1240. At the receiver, differential receivers 1250 may be employed or the signals may be received in a single-ended fashion. A ROE unit 1220 jointly processes the outputs of the receivers 1250 to equalize the signals across the 2n wires. In some embodiments, the transmitter unit 1210 and receiver unit 1220 are located in different devices. This is the setting of device-to-device communications and the communication bus 130 may consist of, e.g., a cable comprising multiple physical wires.

The invention claimed is:

1. A system for equalizing a set of signals transmitted over a communication bus, the system comprising:
   a sampler configured to obtain a plurality of vector samples of the signals on the communication bus; and
   a plurality of rank-order equalization units arranged in parallel, wherein each of the rank-order equalization units is connected with the sampler so as to receive at least a first and a second vector sample from the sampler, the rank-order equalization units including:
      a rank-order unit configured to sort the first vector sample;
      a coefficient selector configured to select a set of coefficients based on the result of the rank-order unit; and
      a subtraction unit operative to subtract the set of coefficients from the second vector sample to produce an equalized vector.

2. The system of claim 1, wherein each of the rank-order equalization units is connected with the sampler so as to share at least one vector sample with at least one other rank-order equalization unit.

3. The system of claim 1, wherein each of the rank-order equalization units further includes a decode unit connected to an output of the respective subtraction unit to decode the equalized vector.

4. The system of claim 1, wherein the rank-order units are configured to sort the respective vector samples in decreasing order.

5. The system of claim 1, wherein the rank-order units are configured to sort the respective vector samples in increasing order.

6. The system of claim 1, wherein the rank-order units are configured to find the two largest samples and the two smallest samples of the respective vector samples.

7. A system for equalizing a set of signals transmitted over a communication bus, the system comprising:
   a sampler configured to obtain a plurality of vector samples of the signals on the communication bus; and
   a plurality of rank-order equalization units arranged consecutively, including a first rank-order equalization unit and a plurality of subsequent rank-order equalization units;
   wherein each of the subsequent rank-order equalization units is connected with a preceding rank-order equalization unit so as to receive an equalized vector and is connected with the sampler so as to receive a vector sample, each of the subsequent rank-order equalization units including:
      a rank-order unit configured to sort the equalized vector;
      a coefficient selector configured to select a set of coefficients based on the result of the rank-order unit; and
      a subtraction unit operative to subtract the set of coefficients from the vector sample to produce a subsequent equalized vector.

8. The system of claim 7, wherein each of the rank-order equalization units further includes a decode unit connected to an output of the respective subtraction unit to decode the subsequent equalized vector.

9. The system of claim 7, wherein the rank-order units are configured to sort the respective received equalized vectors in decreasing order.

10. The system of claim 7, wherein the rank-order units are configured to sort the respective received equalized vectors in increasing order.

11. The system of claim 7, wherein the rank-order units are configured to find the two largest samples and the two smallest samples of the respective received equalized vectors.

* * * * *